United States Patent
Zhang et al.

(10) Patent No.: US 12,007,230 B2
(45) Date of Patent: Jun. 11, 2024

(54) PACKAGING STRUCTURE OF FLEXIBLE SENSING STRIP FOR MONITORING LARGE DEFORMATION AT DEEP POSITION OF SLIDING MASS AND MONITORING METHOD

(71) Applicant: CHINA UNIVERSITY OF GEOSCIENCES (WUHAN), Wuhan (CN)

(72) Inventors: Yongquan Zhang, Wuhan (CN); Huiming Tang, Wuhan (CN); Junrong Zhang, Wuhan (CN); Changdong Li, Wuhan (CN); Guiying Lu, Wuhan (CN); Yuansheng Wang, Wuhan (CN); Ding Xia, Wuhan (CN); Chengyuan Lin, Wuhan (CN)

(73) Assignee: CHINA UNIVERSITY OF GEOSCIENCES (WUHAN), Wuhan (CN)

( * ) Notice: Subject to any disclaimer, the term of this patent is extended or adjusted under 35 U.S.C. 154(b) by 418 days.

(21) Appl. No.: 17/401,332

(22) Filed: Aug. 13, 2021

(65) Prior Publication Data
US 2022/0412718 A1 Dec. 29, 2022

Related U.S. Application Data

(63) Continuation of application No. PCT/CN2021/107489, filed on Jul. 21, 2021.

(30) Foreign Application Priority Data

Jun. 24, 2021 (CN) .......................... 202110705678.X

(51) Int. Cl.
*G01B 7/16* (2006.01)
*G01P 15/09* (2006.01)
(Continued)

(52) U.S. Cl.
CPC ............ *G01B 7/20* (2013.01); *G01P 15/0922* (2013.01); *H05K 7/026* (2013.01); *H05K 7/1432* (2013.01)

(58) Field of Classification Search
CPC ... G01B 5/30; G01B 7/16; G01B 7/18; G01B 7/20
See application file for complete search history.

(56) References Cited

U.S. PATENT DOCUMENTS 8,130,101 B2 * 3/2012 Pellen .................... G01K 13/00
340/568.2
9,267,330 B2 2/2016 Rinzler et al.
(Continued)

FOREIGN PATENT DOCUMENTS

| CN | 104833328 A | 8/2015 |
|---|---|---|
| CN | 105783823 A | 7/2016 |
| CN | 108917695 A | 11/2018 |

*Primary Examiner* — Erika J. Villaluna
(74) *Attorney, Agent, or Firm* — True Shepherd LLC; Andrew C. Cheng

(57) ABSTRACT

A measurement unit module includes a printed circuit board (PCB) and electronic components being mounted on a front face of the PCB, a plurality of measurement unit modules are arranged at intervals in an extending direction of a stripped flat cable, the stripped flat cable is electrically connected to back faces of the plurality of PCBs in sequence to form a measurement unit cluster, the measurement unit cluster is packaged and molded by an extrusion technology of silica gel to form the flexible sensing strip, and the flexible sensing strip can be wound into a sensing strip reel. The packaging structure has the beneficial effects that connection integrity between the measurement unit modules is enhanced, connection strength is improved, and reliability of a flexible clinometer is improved. The flexible sensing strip can be wound into the sensing strip reel so as to be convenient to carry and convey.

9 Claims, 4 Drawing Sheets

(51) Int. Cl.
 *H05K 7/02* (2006.01)
 *H05K 7/14* (2006.01)

(56) References Cited

U.S. PATENT DOCUMENTS

| | | |
|---|---|---|
| 10,712,738 B2 | 7/2020 | Cella et al. |
| 10,732,621 B2 | 8/2020 | Cella et al. |
| 2015/0096782 A1* | 4/2015 | Feldmeier ............ H01B 7/1855 |
| | | 174/102 R |
| 2018/0321402 A1* | 11/2018 | Mattsson ............... G01V 1/186 |
| 2023/0048524 A1* | 2/2023 | Amano .................. H05K 1/028 |

* cited by examiner

PACKAGING STRUCTURE OF FLEXIBLE SENSING STRIP FOR MONITORING LARGE DEFORMATION AT DEEP POSITION OF SLIDING MASS AND MONITORING METHOD

CROSS-REFERENCE TO RELATED APPLICATIONS

This application is a continuation of International Patent Application No. PCT/CN2021/107489 with a filing date of Jul. 21, 2021, designating the United States, now, and further claims priority to Chinese Patent Application No. 202110705678.X with a filing date of Jun. 24, 2021. The content of the aforementioned applications, including any intervening amendments thereto, are incorporated herein by reference.

TECHNICAL FIELD

The present disclosure relates to the technical field of geological disaster monitoring and prevention, and particularly relates to a packaging structure of a flexible sensing strip for monitoring large deformation at a deep position of a sliding mass and a monitoring method.

BACKGROUND

With the wide distribution range, sizeable damage and long duration, the landslide disaster seriously affects the regional urbanization construction, the main line of railway traffic and the utilization of water resources on a global scale, so it is considered as one of the most concerned natural disasters. As the monitoring technology advances, professional geological disaster risk investigation, hidden danger inspection and early identification combined with multiple technology categories have become important ways for scientifically and actively preventing landslide disaster loss. Deformation monitoring is the most direct and effective way of identification, early warning and decision management of the landslide disaster.

Landslide deformation can be monitored by a level gauge, a global positioning system (GPS) observation station, a crack meter, a time-domain reflectometry (TDR) technology, a clinometer with a fiber grating sensing technology, a stay wire type displacement meter, etc., which have higher precision, automation, reliability, etc. over time. However, due to the large deformation, multiple evolution stages, long duration and other features of the landslide deformation, the above-mentioned monitoring means are often technically confined and limited in use, and it is difficult to reflect the evolution features and deformation laws of a complete cycle of landslide deformation. In recent years, in view of this, a flexible inclinometry technique, for example, a microelectronic technology based deformation sensor sequence such as Canadian Shape Accel Array (SAA), consisting of a three-segment continuous shaft and a micro electro mechanical system accelerometer has been introduced. Related technologies including patents CN104833328A, CN108917695A and CN105783823A are also available in China. In such technologies, all measurement nodes are connected via flexible connectors in a point mode, which may adaptively deform to avoid damage, but has poor connectivity, susceptibility to tension and poor reliability. Therefore, based on the monitoring environment and stress features of a flexible clinometer, it is of prominent significance to introduce a packaging technology which may strengthen the connection between measurement nodes to enhance the reliability of the flexible clinometer.

SUMMARY

In view of this, the embodiments of the present disclosure provide a packaging structure of a flexible sensing strip for monitoring large deformation at a deep position of a sliding mass and a monitoring method for solving the above problems.

The embodiments of the present disclosure provide a packaging structure of a flexible sensing strip for monitoring large deformation at a deep position of a sliding mass and a monitoring method, including a plurality of measurement unit modules and a stripped flat cable, where the measurement unit module includes a printed circuit board (PCB) and electronic components, the electronic components being mounted on a front face of the PCB, the plurality of measurement unit modules are arranged at intervals in an extending direction of the stripped flat cable, the stripped flat cable is electrically connected to back faces of the plurality of PCBs in sequence to form a measurement unit cluster, the measurement unit cluster is packaged and molded by means of an extrusion technology of silica gel to form the flexible sensing strip, and the flexible sensing strip may be wound into a sensing strip reel.

Further, the measurement unit module may further include a plurality of pairs of interface bonding pads, each pair of interface bonding pads being symmetrically mounted on a front face and a back face of the PCB, through holes penetrating positions, corresponding to each pair of interface bonding pads, of the PCB, each pair of interface bonding pads having consistent electric properties, and the stripped flat cable being electrically connected to the interface bonding pads.

Further, the stripped flat cable may include a cable core and a packaging sheath wrapped around the cable core, the packaging sheath at a position, corresponding to the interface bonding pad, of the stripped flat cable may be scraped to expose the cable core, and the exposed cable core may be electrically connected to the interface bonding pad.

Further, the cable core of the stripped flat cable may be a tinned flat cable.

Further, the exposed cable core and the interface bonding pad may be welded by means of hot melting tin soldering.

Further, the packaging structure of a flexible sensing strip for monitoring large deformation at a deep position of a sliding mass may further include a U-shaped conductive buckle, where the U-shaped conductive buckle may be provided with a U-shaped connection portion and two clamping portions, the two clamping portions being bent outwards separately to form bent portions, and the bent portions penetrating the through hole to be buckled to the interface bonding pad on the front face of the PCB, and the exposed cable core may be located on an inner side of the U-shaped connection portion.

Further, the packaging structure of a flexible sensing strip for monitoring large deformation at a deep position of a sliding mass may further include a steel wire rope, where the steel wire rope and the stripped flat cable may extend in an identical direction, and the steel wire rope may be located on the back face of the PCB and packaged in the measurement unit cluster by means of the extrusion technology of silica gel.

Further, the two steel wire ropes may be located on two sides of the stripped flat cable separately.

Further, the electronic components may include a micro electro mechanical system, a nine-axis sensor, a microprocessor, a controller area network (CAN)bus driver and a power management chip.

The embodiment of the present disclosure further provides a monitoring method, based on packaging structure of a flexible sensing strip for monitoring large deformation at a deep position of a sliding mass, including the following steps:

S1, winding the flexible sensing strip into a sensing strip reel, and carrying same to a monitoring site;

S2, unwinding the sensing strip reel, attaching the flexible sensing strip to a clamping steel strip to be embedded into a clamping groove of a clinometer pipe in a monitoring hole, and fixedly burying the flexible sensing strip in a sliding mass to undergo coupling deformation along with the sliding mass; and S3, supplying power to the flexible sensing strip by electrically connecting a solar power supply to the flexible sensing strip, and reading data, measured by the flexible sensing strip, of each measurement unit by electrically connecting a controller to the flexible sensing strip, so as to automatically monitor deformation at a deep position of the sliding mass in real time.

The technical solution provided by the embodiments of the present disclosure has the beneficial effects that a plurality of measurement unit modules are electrically connected to a stripped flat cable to form a measurement unit cluster, and the measuring unit cluster is packaged and molded by means of an extrusion technology of silica gel to form a flexible sensing strip, which enhances connection integrity between the measurement unit modules and improves connection strength, so as to improve reliability of a flexible clinometer. The flexible sensing strip has desirable flexibility, and may be wound into a sensing strip reel so as to be convenient to carry and convey. When applied to monitoring of large displacement at a deep position of a field sliding mass, the flexible sensing strip is buried in a sliding mass, has satisfactory coupling coordination with sliding deformation of the sliding mass, and may undergo coupling deformation along with the sliding mass, which may satisfy a requirement for monitoring large deformation.

Figure 1:
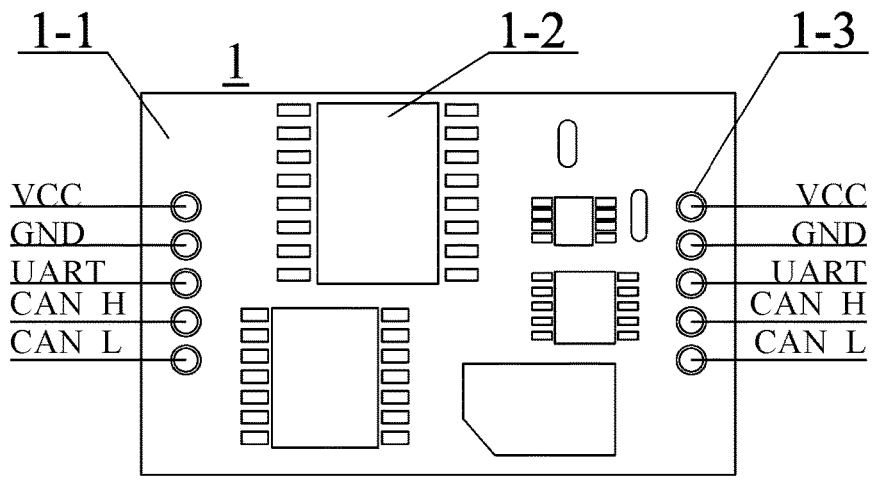
FIG. 1 is a schematic structural diagram of an embodiment of a measurement unit module in a packaging structure of a flexible sensing strip for monitoring large deformation at a deep position provided in the present disclosure.
Figure 2:
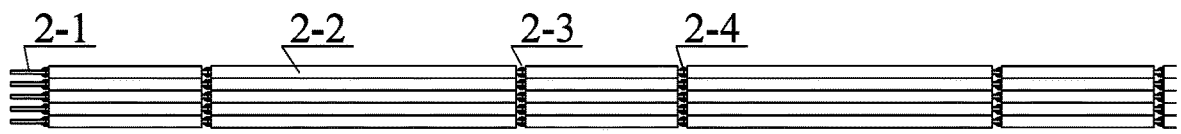
FIG. 2 is a schematic structural diagram of an embodiment of a stripped flat cable in the packaging structure of a flexible sensing strip for monitoring large deformation at a deep position provided in the present disclosure.
Figure 3:
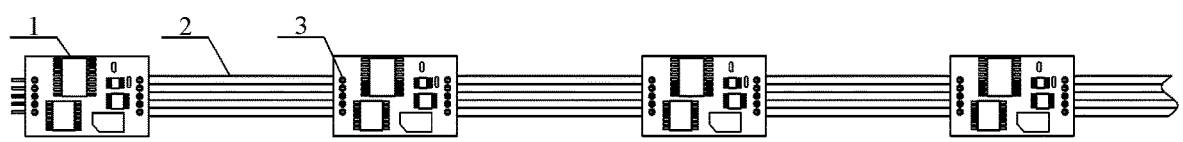
FIG. 3 is a front view of a measurement unit cluster formed by connecting the measurement unit module in FIG. 1 to the stripped flat cable in FIG. 2.
Figure 4:
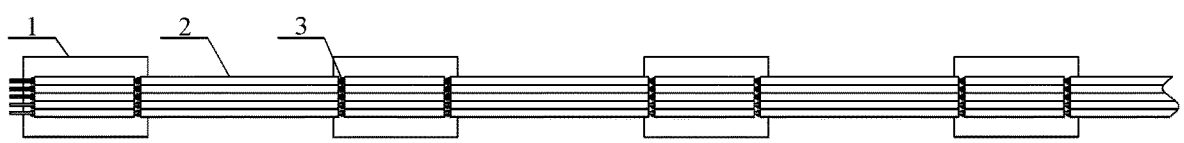
FIG. 4 is a back view of the measurement unit cluster.
Figure 5:
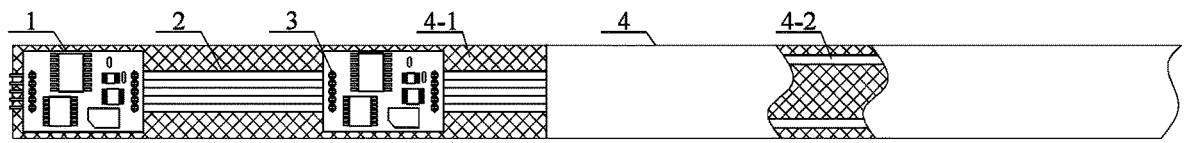
FIG. 5 is a front view of the flexible sensing strip.
Figure 6:
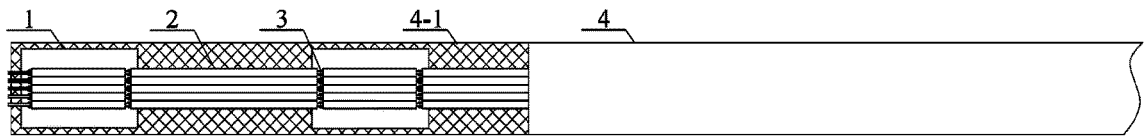
FIG. 6 is a back view of the flexible sensing strip.
Figure 7:
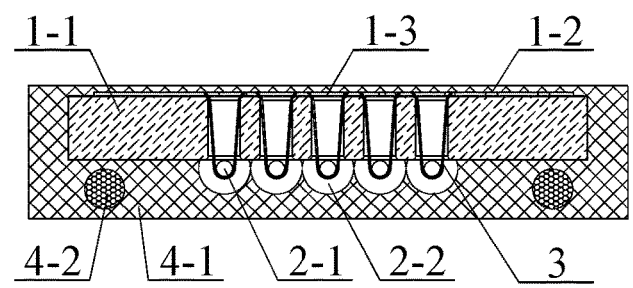
FIG. 7 is a cutaway view of the flexible sensing strip.
Figure 8:
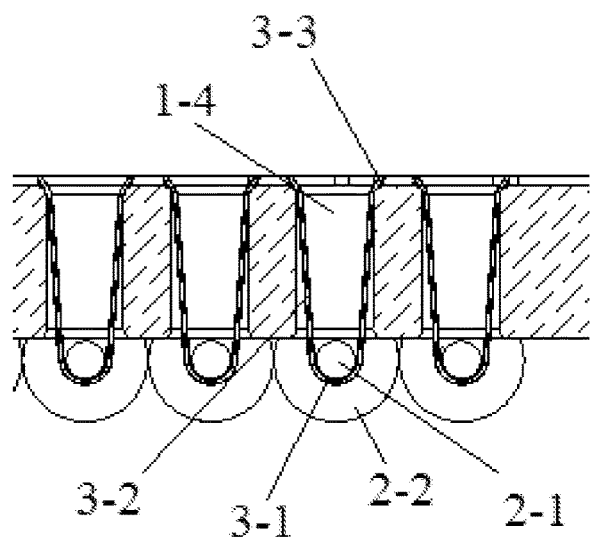
FIG. 8 is a partially enlarged diagram of the flexible sensing strip in FIG. 7.
Figure 9:
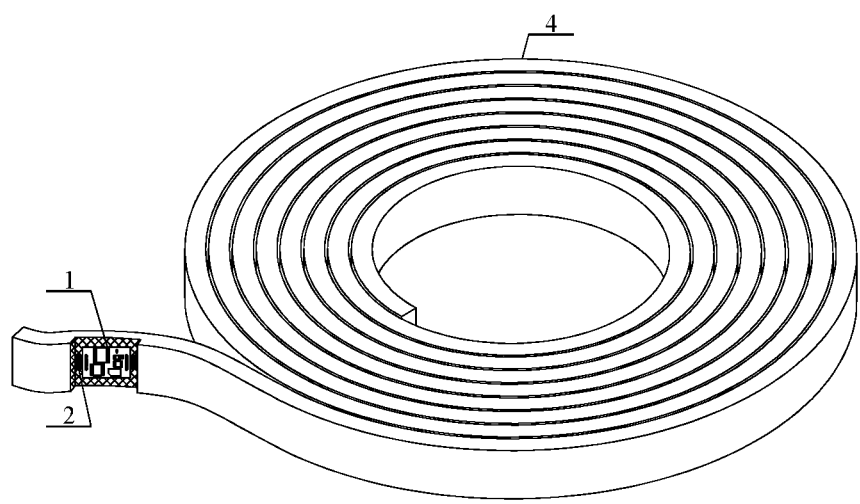
FIG. 9 is a schematic structural diagram that the flexible sensing strip is wound into a sensing strip reel.
Figure 10:
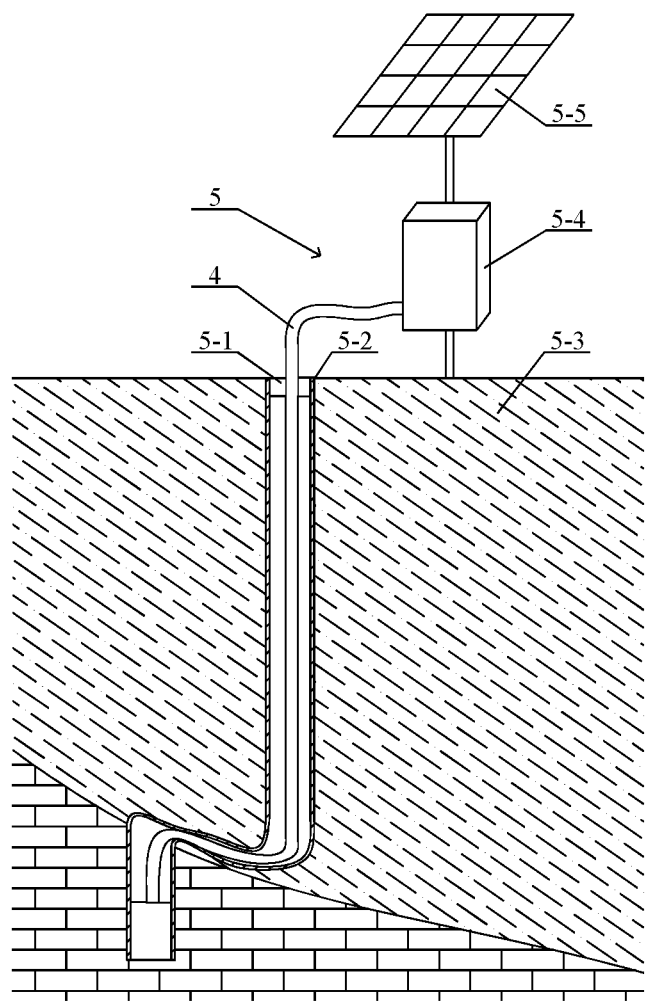
FIG. 10 is a schematic diagram of mounting the flexible sensing strip on site.

In the figures: measurement unit module 1, PCB 1-1, electronic component 1-2, interface bonding pad 1-3, through hole 1-4, stripped flat cable 2, cable core 2-1, packaging sheath 2-2, U-shaped conductive buckle 3, U-shaped connection portion 3-1, clamping portion 3-2, bent portion 3-3, flexible sensing strip 4, silica gel 4-1, steel wire rope 4-2, field supporting facility 5, monitoring hole 5-1, clinometer pipe 5-2, sliding mass 5-3, controller 5-4, and solar power supply 5-5.

DETAILED DESCRIPTION OF THE EMBODIMENTS

In order to make the objectives, technical solutions and advantages of the present disclosure clearer, the implementations of the present disclosure are described in more detail below with reference to the accompanying drawings.

With reference to FIGS. 1-9, the embodiments of the present disclosure provide a packaging structure of a flexible sensing strip for monitoring large deformation at a deep position of a sliding mass, including a plurality of measurement unit modules 1 and a stripped flat cable 2.

The measurement unit module 1 includes a printed circuit board (PCB) 1-1 and electronic components 1-2, where the electronic components 1-2 include a micro electro mechanical system, a nine-axis sensor, a microprocessor, a controller area network (CAN)bus driver and a power management chip and may synchronously measure a triaxial acceleration, a triaxial angular velocity and a triaxial angle. The electronic component 1-2 is mounted on a front face of the PCB 1-1, the plurality of measurement unit modules 1 are arranged at intervals in an extending direction of the stripped flat cable 2, the specific number of the measuring unit modules 1 is customized according to a monitoring span and a spacing, the stripped flat cable 2 is electrically connected to back faces of the plurality of PCBs 1-1 in sequence to form a measurement unit cluster, the measurement unit cluster is packaged and molded by means of an extrusion technology of silica gel 4-1 to form the flexible sensing strip 4, and the flexible sensing strip 4 may be wound into a sensing strip reel (with reference to FIG. 9), has desirable flexibility, and is convenient to carry or covey.

In order to facilitate connection between the stripped flat cable 2 and the PCB 1-1, the measurement unit module 1 further includes a plurality of pairs of interface bonding pads 1-3 and a U-shaped conductive buckle 3. Each pair of interface bonding pads 1-3 is symmetrically mounted on a front face and a back face of the PCB 1-1, through holes 1-4 penetrate positions, corresponding to each pair of interface bonding pads 1-3, of the PCB 1-1, each pair of interface bonding pads 1-3 has consistent electric properties and are strictly centered, and the stripped flat cable 2 is electrically connected to the interface bonding pads 1-3. Two ends of the PCB 1-1 are each provided with the plurality of pairs of interface bonding pads 1-3, and the interface bonding pads 1-3 at the two ends of the PCB 1-1 are symmetrically arranged.

A length of the stripped flat cable 2 is integrally customized according to a length of the final flexible sensing strip 4, the stripped flat cable 2 includes a cable core 2-1 and a packaging sheath 2-2 wrapped around the cable core 2-1, the cable core 2-1 of the stripped flat cable 2 is a tinned flat cable, the packaging sheath 2-2 at a position, corresponding to the interface bonding pad 1-3, of the stripped flat cable 2 is scraped to expose the cable core 2-1, the exposed cable core 2-1 is electrically connected to the interface bonding pad 1-3, and the exposed cable core 2-1 and the interface bonding pad 1-3 are welded by means of hot melting tin soldering, which avoids multi-section splicing and guarantees an electric channel to be a whole.

The U-shaped conductive buckle 3 is provided with a U-shaped connection portion 3-1 and two clamping portions 3-2, the two clamping portions 3-2 being bent outwards separately to form bent portions 3-3, and the bent portions 3-3 penetrating the through hole 1-4 to be buckled to the interface bonding pad 1-3 on the front face of the PCB 1-1, and the exposed cable core 2-1 may be located on an inner side of the U-shaped connection portion 3-1. A stripped position (the exposed cable core 2-1) of the stripped flat cable 2 corresponds to the interface bonding pad 1-3 of the measurement unit module 1, the exposed cable core 2-1 is buckled at the through hole 1-4 corresponding to the interface bonding pad 1-3 in a sleeving mode by means of the U-shaped conductive buckle 3, the U-shaped conductive buckle 3 may guarantee a relative position between the stripped flat cable 2 and the PCB 1-1, and the cable core 2-1 and the interface bonding pad 1-3 are firmly welded by means of the hot melting soldering tin.

The steel wire rope 4-2 and the stripped flat cable 2 extend in an identical direction, and the steel wire rope 4-2 is located on the back face of the PCB 1-1 and packaged in the measurement unit cluster by means of the extrusion technology of silica gel 4-1, which may enhance the overall tensile strength of the finished flexible sensing strip 4. In this embodiment, the two steel wire ropes 4-2 are located on two sides of the stripped flat cable 2 separately. In an arrangement state, formed by guide of a die, shown in a cross section in FIG. 6, the measurement unit cluster and the steel wire rope 4-2 are uniformly wrapped in silica gel 4-1 extruded by an extruder of the silica gel 4-1 to form a rudiment of the flexible sensing strip 4, and then the rudiment is horizontally conveyed for a long distance to an oven to be baked, cured and shaped. Particularly, the measurement unit cluster is integrally sealed after being packaged by means of the extrusion technology of silica gel 4-1, and has a protection grade of IP68.

Figure 11:
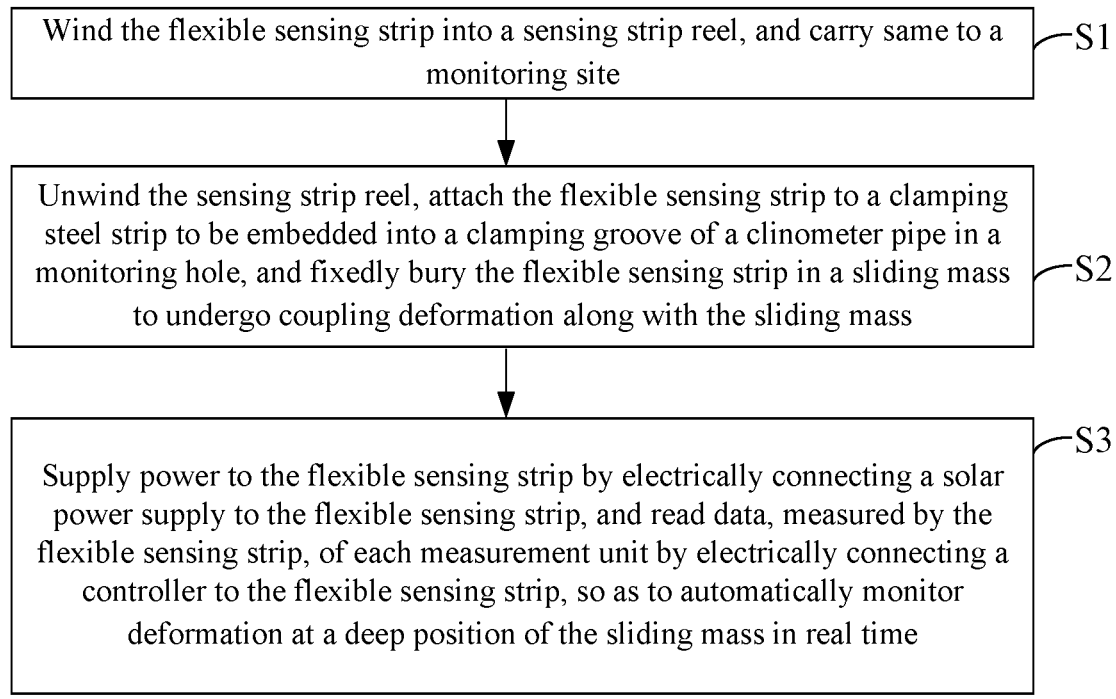
FIG. 11 is a schematic diagram of a flowchart of an embodiment of a monitoring method provided in the present disclosure.

With reference to FIG. 11, based on the packaging structure of a flexible sensing strip for monitoring large deformation at a deep position of a sliding mass, the embodiment of the present disclosure provides a monitoring method, which includes the following steps:

S1, a flexible sensing strip 4 is wound into a sensing strip reel and carried to a monitoring site;

S2, the sensing strip reel is unwound, and the flexible sensing strip 4 is attached to a clamping steel strip to be embedded into a clamp groove of a clinometer pipe 5-2 in a monitoring hole 5-1 and fixedly buried in a sliding mass 5-3 to undergo coupling deformation along with the sliding mass 5-3, which may satisfy a requirement for monitoring large deformation; and S3, power is supplied to the flexible sensing strip 4 by electrically connecting a solar power supply 5-5 of a field supporting facility 5 to the flexible sensing strip 4, and data, measured by the flexible sensing strip, of each measurement unit is read by electrically connecting a controller 5-4 to the flexible sensing strip 4, so as to automatically monitor deformation at a deep position of the sliding mass 5-3 in real time.

In the technical solution provided in the present disclosure, a plurality of measurement unit modules 1 are electrically connected to a stripped flat cable 2 to form a measurement unit cluster, and the measuring unit cluster is packaged and molded by means of an extrusion technology of silica gel 4-1 to form a flexible sensing strip 4, which enhances connection integrity between the measurement unit modules 1 and improves connection strength, so as to improve reliability of a flexible clinometer. The flexible sensing strip 4 has desirable flexibility, and may be wound into a sensing strip reel so as to be convenient to carry and convey. When applied to monitoring of large displacement at a deep position of a field sliding mass, the flexible sensing strip 4 is buried in a sliding mass 5-3, has satisfactory coupling coordination with sliding deformation of the sliding mass 5-3, and may undergo coupling deformation along with the sliding mass 5-3, which may satisfy a requirement for monitoring large deformation.

Herein, the involved terms front, rear, upper, lower, etc., are defined in terms of the positions of parts and between the parts in the drawings, just for clarity and convenience of expressing the technical scheme. It should be understood that the use of such parties should not limit the scope of protection of the claimed application.

The above embodiments and the features of the embodiments herein may be combined with each other without conflict.

The above embodiment is merely a preferred embodiment of the present disclosure but not intended to limit the present disclosure, and any modifications, equivalent replacements, improvements, etc. made within the spirit and principles of the present disclosure should be comprised within the scope of protection of the present disclosure.

What is claimed is:

1. A packaging structure of a flexible sensing strip for monitoring large deformation at a deep position of a sliding mass, comprising a plurality of measurement unit modules and a stripped flat cable, wherein each of the plurality of measurement unit modules comprises a printed circuit board (PCB) and electronic components, the electronic components being mounted on a front face of the PCB, the plurality of measurement unit modules are arranged at intervals in an extending direction of the stripped flat cable, the stripped flat cable is electrically connected to back faces of the plurality of PCBs in sequence to form a measurement unit cluster, the measurement unit cluster is packaged and molded by an extrusion technology of silica gel to form the flexible sensing strip, and the flexible sensing strip is capable of being wound into a sensing strip reel;

each of the plurality of measurement unit modules further comprises a plurality of pairs of interface bonding pads, each pair of interface bonding pads being symmetrically mounted on a front face and a back face of the PCB, through holes penetrating positions, corresponding to each pair of interface bonding pads, of the PCB, each pair of interface bonding pads having consistent electric properties, and the stripped flat cable being electrically connected to the interface bonding pads.

2. The packaging structure according to claim 1, wherein the stripped flat cable comprises a cable core and a packaging sheath wrapped around the cable core, the packaging sheath at a position, corresponding to the interface bonding pad, of the stripped flat cable is scraped to expose the cable core, and the exposed cable core is electrically connected to the interface bonding pad.

3. The packaging structure according to claim 2, wherein the cable core of the stripped flat cable is tinned.

4. The packaging structure according to claim 3, wherein the exposed cable core and the interface bonding pad are welded by hot melting tin soldering.

5. The packaging structure according to claim 2, further comprising a U-shaped conductive buckle, wherein the U-shaped conductive buckle is provided with a U-shaped connection portion and two clamping portions, the two clamping portions being bent outwards separately to form bent portions, and the bent portions penetrating the through holes to be buckled to the interface bonding pad on the front face of the PCB, and the exposed cable core is located on an inner side of the U-shaped connection portion.

6. The packaging structure according to claim 1, further comprising a steel wire rope, wherein the steel wire rope and the stripped flat cable extend in an identical direction, and the steel wire rope is located on the back face of the PCB and packaged in the measurement unit cluster by the extrusion technology of silica gel.

7. The packaging structure according to claim 6, wherein two steel wire ropes are located on two sides of the stripped flat cable separately.

8. The packaging structure according to claim 1, wherein the electronic components comprise a micro electro mechanical system, a nine-axis sensor, a microprocessor, a controller area network (CAN) bus driver and a power management chip.

9. A monitoring method, based on the packaging structure of a flexible sensing strip for monitoring large deformation at a deep position of a sliding mass according to claim 1, and comprising:
- S1, winding the flexible sensing strip into a sensing strip reel, and carrying same to a monitoring site;
- S2, unwinding the sensing strip reel, attaching the flexible sensing strip to a clamping steel strip to be embedded into a clamping groove of a clinometer pipe in a monitoring hole, and fixedly burying the flexible sensing strip in a sliding mass to undergo coupling deformation along with the sliding mass; and
- S3, supplying power to the flexible sensing strip by electrically connecting a solar power supply to the flexible sensing strip, and reading data, measured by the flexible sensing strip, of—the plurality of measurement unit modules by electrically connecting a controller to the flexible sensing strip, so as to automatically monitor deformation at a deep position of the sliding mass in real time.

* * * * *